United States Patent [19]
Shanthi-Pavan et al.

[11] Patent Number: 5,945,889
[45] Date of Patent: Aug. 31, 1999

[54] METHOD AND APPARATUS FOR TUNING HIGH Q BANDPASS FILTERS USING PULSE EXCITATION

[75] Inventors: Yendluri Shanthi-Pavan, New York, N.Y.; Krishnaswamy Nagaraj, Somerville; Venugopal Gopinathan, Leonardo, both of N.J.

[73] Assignee: Texas Instruments Incorporated, Dallas, Tex.

[21] Appl. No.: 08/910,688

[22] Filed: Aug. 13, 1997

Related U.S. Application Data

[60] Provisional application No. 60/026,025, Sep. 13, 1996.

[51] Int. Cl.$^6$ .................................................. H03H 11/04
[52] U.S. Cl. .......................... 333/17.1; 333/174; 455/125
[58] Field of Search ................................. 333/17.1, 174; 455/125; 327/553

[56] References Cited

U.S. PATENT DOCUMENTS

| | | | |
|---|---|---|---|
| 4,091,236 | 5/1978 | Chen | 327/553 X |
| 5,200,716 | 4/1993 | Amano | 333/17.1 |
| 5,227,743 | 7/1993 | Yamamoto | 333/17.1 |

OTHER PUBLICATIONS

Donald R.J. White "*A Handbook on Electrical Filters, Synthesis, Design and Applications,*" Fourth printing 1976, pp. 1–7.

*Primary Examiner*—Justin P. Bettendorf
*Attorney, Agent, or Firm*—Ronald O. Neerings; Warren L. Franz; Richard L. Donaldson

[57] ABSTRACT

A high Q bandpass filter (102) is tuned by applying a transient (204) to the filter to cause it to ring. The ringing of the filter produces an output damped oscillatory waveform (206) whose zero crossings (208) are converted to a pulse train (210) and counted in a digital counter (112) to a predetermined number n. The output (214) of the counter is compared to an accurate timing signal (216) which has a time duration equal to the time of n pulses when the filter is accurately tuned. The output of the comparator (118) is applied to an integrator (122) to generate a control signal $V_c$ to tune the filter. The high frequency tuning problem is thus converted to a low frequency, time domain problem which is readily implemented.

14 Claims, 4 Drawing Sheets

METHOD AND APPARATUS FOR TUNING HIGH Q BANDPASS FILTERS USING PULSE EXCITATION

CROSS-REFERENCE TO RELATED APPLICATIONS

This application claims priority under 35 U.S.C. § 119 of provisional application Ser. No. 60/026,025, filed Sep. 13, 1996, entitled "Tuning High-Q Bandpass Filters."

BACKGROUND OF THE INVENTION

This application relates generally to electronic filters and, especially, to the tuning of high quality factor (Q) bandpass electrical circuit filters.

Filters of the type to which the present invention relates are devices that emphasize, de-emphasize, or control the frequency components of desired or undesired signals which might otherwise be present in electrical circuits. The filtering action may be achieved by electrical as well as other means, such as mechanical, piezoelectric, magnetostrictive or acoustic. Bandpass filters are filters which accept energy within a defined band or spectrum and significantly reject it outside that band or spectrum. Bandwidth (BW) is the frequency acceptance window or band between the 3-dB cut-off frequencies in a bandpass filter. In describing bandpass filters, quality factor (Q) is the ratio of the center frequency to the bandwidth. The center frequency (fc) is the geometric mean frequency between the 3-dB cut-off frequencies and may be approximated by the arithmetic mean when the Q factor is high (higher than about 10). See, generally, D. White, *A Handbook on Electrical Filters* (1963 Donald R. J. White, Germantown, Md.).

Filters used for bandpass filters for radio frequency devices such as cellular phones, for example, are typically formed on integrated circuits. Process variations in the integrated circuit manufacturing process yield differences in the center frequency of the bandpass filters that are formed. These filters must therefore be tuned in order for the center of the bandpass frequency to match the desired bandpass characteristic.

One known technique for tuning filters is the master/slave technique in which a master filter is tuned and the control parameters derived from tuning the master filter are used to drive the main filter, which is the slave filter. This system works well for low Q filters but does not work very well for high Q filters because of the narrowness of the high Q filter bandpass characteristic. Even a slight tracking error between the master and slave filters in a high Q filter system can place the bandpass characteristic outside the desirable range.

Another known technique is self-tuning. Here, the main filter itself is used for tuning. This requires the filter to be disconnected from its normal path. In many applications this can be done taking advantage of the idle times which are automatically available. In situations where there are no idle times, it may be necessary to use two such filters, with one being used while the other is being tuned.

The popular technique for implementing self-tuning for a high Q bandpass filter is to apply a sine wave at the desired center frequency and tune the filter until the phase difference between the output and input waves is 90°. A disadvantage of this technique is the requirement to have an accurate sine wave source at the operating frequency. This is not a problem at lower frequencies. However, at higher frequencies, such as 1 GHz, even a small time delay in the circuit will result in a large phase error causing the filter to be mistuned. In addition, the circuits must have a source at the higher frequency and provision must be made to keep the higher frequency from being capacitively coupled to other portions of the circuit and causing interference therein.

Accordingly, there is a need for a low-cost and effective means for tuning the center frequency of high Q bandpass filters which is highly accurate and does not require a sine wave source at the center frequency.

SUMMARY OF THE INVENTION

It is a general object of the present invention to provide a method and apparatus for tuning electronic filters.

It is a further object of the present invention to provide a method and apparatus for tuning the center frequency of a bandpass filter.

Another object of the present invention is to provide a method and apparatus for tuning the center frequency of a ban dpass filter formed on an integrated circuit.

These and other objects, advantages and features are provided, in accordance with one aspect of the present invention, by a method of detecting the center frequency of a bandpass filter. The filter is excited with a pulse causing the filter to ring at its tuned frequency. A predetermined number of cycles of the oscillating waveform generated by the ringing of the filter is counted. The time taken for the predetermined number of cycles to occur is compared with a known time reference.

Another aspect of the present invention is an apparatus for detecting the center frequency of a filter. A pulse generator excites the filter with a pulse causing the filter to ring at its tuned frequency. A counter counts a predetermined number of cycles of the oscillating waveform generated by the ringing of the filter. A comparator compares the time of the predetermined number of cycles with a known time reference.

A further aspect of the present invention is a method of tuning a filter. The filter is excited with a pulse causing the filter to ring at its tuned frequency. A predetermined number of cycles of the oscillating waveform generated by the ringing of the filter is counted. The time taken for the predetermined number of cycles to occur is compared with a known time reference to generate an output signal. The output signal is used to tune the filter.

Yet another aspect of the present invention is an apparatus for tuning a filter. A pulse generator excites the filter with a pulse for causing the filter to ring at its tuned frequency. A counter counts a predetermined number of cycles of the oscillating waveform generated by the ringing of the filter. A comparator compares the time taken for the predetermined number of cycles with a known time reference to generate an output signal. The output signal is used to tune the filter.

Yet another aspect of the present invention is an apparatus for tuning a filter. A pulse generator excites the filter with a pulse for causing the filter to ring at its tuned frequency. A counter counts a predetermined number of oscillatory waveforms generated by the ringing of the filter. A comparator compares the elapsed time of the predetermined number of oscillatory pulses with a reference signal to generate an output signal. An integrator integrates the output signal to generate a control signal to tune the filter.

BRIEF DESCRIPTION OF THE DRAWINGS

Throughout the drawings, like numerals refer to like elements.

DETAILED DESCRIPTION

Figure 1:
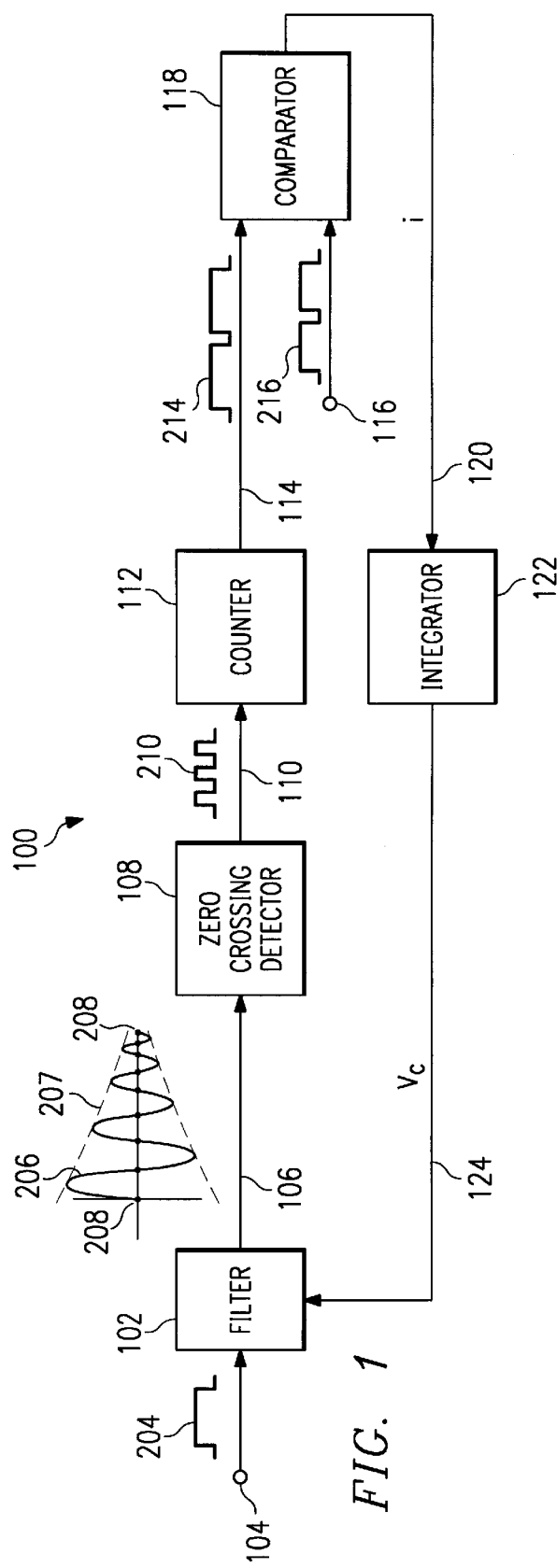
FIG. 1 is a block diagram of a filter tuning circuit embodiment of the present invention.

FIG. 1 is a block diagram showing an electronic filter tuning circuit 100 in accordance with the principles of the present invention. A filter 102, such as an integrated bandpass filter, is coupled to input terminal 104 for receiving an excitation input pulse which causes the filter to ring at its then set center frequency (fc). Filter 102 has a high Q factor of at least 10 and typically in the range of 10–20. The oscillating waveform that results from the ringing of filter 102 appears at the output of the filter on line 106 and is input to a zero crossing detector 108. Zero crossing detector 108 is used to detect the zero crossings in the oscillating waveform and may, for example, take the form of a Schmitt trigger. The output of zero crossing detector 108 is a series of digital pulses on line 110, with each pulse corresponding to a detected zero crossing in the oscillating output of filter 102 on line 106.

Line 110 couples the zero crossing pulse train to the input of a digital counter 112, which counts to a predetermined number n which may be an arbitrary number chosen by the circuit designer. The output of counter 112 is fed on line 114 as a first input to a comparator 118. A second input to comparator 118 is an accurate known time reference applied at terminal 116 and which has a time period duration equal to the duration of n zero crossing pulses at a desired center frequency. The difference between the output of counter 112 and the reference generates a difference signal at the output 120 of comparator 118 that is fed to an integrator 122. Integrator 122 integrates this difference to generate a control signal on line 124 which adjusts the center frequency of filter 102 to align it with the desired center frequency.

The excitation pulse applied at terminal 114 can be of any frequency chosen by the designer, but needs to have a sufficiently sharp transient to cause the filter 102 to ring at its currently set center frequency. The frequency of the pulse is determined by the speed at which the filter needs to be tuned. The pulse may, for example, take the form of a square wave pulse 204 (FIG. 1) having an amplitude equal to the full scale filter operation amplitude (e.g., 1-volt amplitude pulse for a 1-volt full scale operating voltage filter) and a duration (e.g., 20–30 system clock pulse cycles) long enough to ensure that the filter receives an initial impulse sufficient to cause it to ring.

The output of the ringing filter 102 on line 106 is a damped oscillating waveform 206 that has an amplitude decay envelope (dashed lines 207) which decreases exponentially over time. The frequency of oscillation is the same as the then set center frequency (fc) of filter 102, and its period (T=2π/fc) can be defined by the elapsed time between one zero crossing 208 and the next-but-are zero crossing 208. Each of the zero crossings 208 of the filter output 206 is detected by zero crossing detector 108 to generate a pulse on line 110. The frequency of the pulses in the pulse train 210 at 110 (viz., the frequency of zero crossings 208 detected by zero detector 108) will be twice the frequency (fc) of the ringing filter output 206. The period of the pulses in the pulse train 210 will be one-half the period of the ringing filter output 206. The pulse train 210 on line 110 is used to increment digital counter 112 to count to a predetermined number n of zero crossing pulses. This predetermined number n can be any number but is preferably moderately long so as to avoid the need for critical components. For example, if a short duration count is chosen, then even a very small delay through the control circuit can yield a large error in the center frequency. However, if a larger number, for example n=20 or 30, is chosen, then small delays will not have a great impact on the accuracy of the tuning of the center frequency of the filter 102. The utilization of the zero crossing detector 108 and counter 112 converts the task of tuning high frequency/short period filters into a lower frequency/longer period tuning problem, which is more easily solved. The output 214 of counter 112 on line 114 is a series of pulses which are 2/n times the frequency and n/2 (for example, n=20 or 30) times the period of the series of zero crossing detection output pulses at 110. This lower frequency/longer period signal 214, shown at the output of counter 112 in FIG. 1, is fed as a first input to comparator 118. Terminal 116 receives an accurate known timing reference signal 216 which is coupled into a second input of comparator 118. The timing signal 216 applied at 116 may be a series of pulses which correspond to what the signal 214 would look like were the center frequency (fc) of filter 102 properly tuned to the desired center frequency. The timing signal 216 may thus be a series of pulses having a frequency which is 2/n times the desired center frequency and a period which is n/2 times the period (elapsed time between one zero crossing and the next-but-one zero crossing) of the filter oscillating at the desired center frequency. Because the frequency of the reference signal applied at 116 is on the order of 10 or 15 times, for example, lower than the operating frequency of the filter, it is easily generated and less likely to be capacitively coupled into other circuits on the integrated circuit. In the example shown in FIG. 1, the pulses of output 214 of counter 112 have a period which is longer than the pulses of the reference signal 216 applied at 116, indicating that the actual frequency of filter 102 is lower than the desired frequency.

The output of comparator 118 on line 120 is a timing difference signal i which is developed based on the difference between the input signals 214 and 216 applied at 114 and 116, and which is then integrated by an integrator 122 to provide a control signal $V_c$ on line 124 for tuning filter 102.

Each time the tuning operation is performed, the signal i output of comparator 118 is integrated by integrator 122 to generate a control signal on line 124 which tunes filter 102 to its center frequency, utilizing techniques well known in the art. The output on line 124 can be a DC voltage $V_c$, for example, and filter 102 can be tuned utilizing voltage control tuning techniques. The technique is advantageously applied iteratively until the filter is accurately tuned. The speed at which the filter is tuned to its desired center frequency is determined, in part, by the frequency of the pulses in the excitation signal 204 applied to terminal 104. A higher rate of pulses will allow more iterations in a given time period and thus enable faster control. The filters need to be periodically tuned, and such tuning may be necessary every few milliseconds, depending upon the operation. In a cellular telephone, for example, the tuning of the filter can be accomplished during the lulls in the conversation, making the tuning procedure totally transparent to the user. In those situations in which there are no lulls in the transmission and interruptions in the transmission are not acceptable, it may be necessary to have two such filters, one in use while the other is being tuned.

Figure 2:
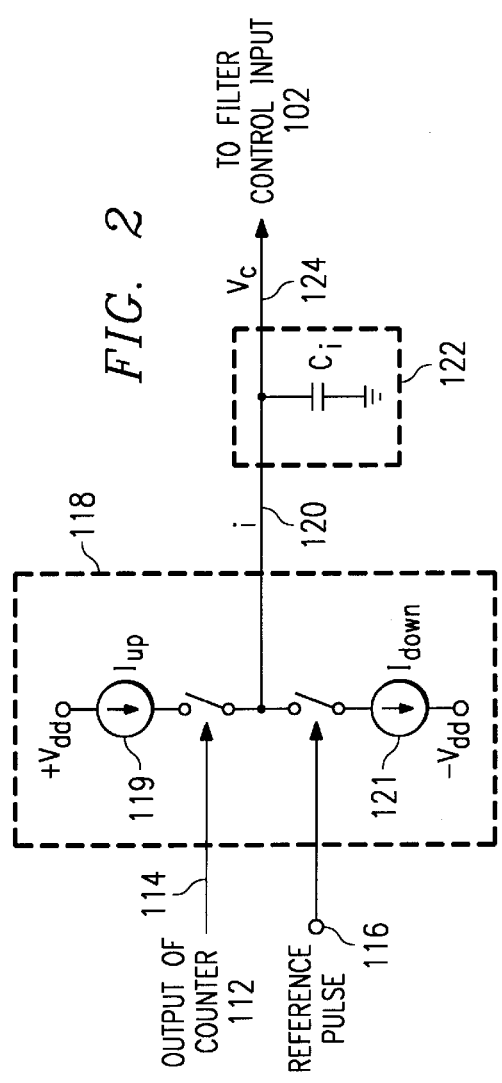
FIG. 2 is a schematic diagram of an implementation of the comparator and integrator of FIG. 1.

Comparator 118 and integrator 122 may be implemented, for example, as shown schematically in FIG. 2. Counter output line 114 is connected to control operation of a positive current source 119, connected between a positive voltage source +$V_{dd}$ and line 120. Reference signal input terminal 116 is connected to control operation of an equal, but opposite, negative current source 121, connected between a line 120 and a negative voltage source -$V_{dd}$. An integrating capacitor $C_i$ has one terminal connected to lines 120 and 124, and the other terminal connected to ground. When the counter output signal 214 at line 114 is high (or, in an alternative implementation, low) and the reference signal 216 at terminal 116 is low (or, in the alternative, high), current $I_{up}$ is flowed from positive voltage source +$V_{dd}$ into line 120 to charge capacitor $C_i$ in a positive direction. On the other hand, when the signal 214 on line 114 is low (or, alternatively, high) and the signal 216 at terminal 116 is high (or, alternatively, low), current $I_{down}$ is flowed out of line 120 to negative voltage source -$V_{dd}$ to charge capacitor $C_i$ in the opposite or negative direction. However, when the signals 214, 216 at line 114 and terminal 116 are either both high or both low, no net current is flowed either into or out of line 120. Thus, when the actual center frequency of filter 102 is lower than the desired center frequency (case shown in FIG. 1), the period of pulses on line 114 will be longer than the period of the pulses at terminal 116, and instances of $I_{up}$ application will exceed instances of $I_{down}$ application. This will lead to development of a net positive charge on capacitor $C_i$ and generation of a positive control voltage $V_c$ on line 124. On the other hand, when the actual center frequency of filter 102 is higher than the desired frequency, the pulses on line 114 will have a shorter period than those at terminal 116, and instances of $I_{down}$ application will dominate, leading to a net negative charge on capacitor $C_i$ and generation of a negative control voltage $V_c$. The control voltage $V_c$ will then be used in known ways to increase or decrease the frequency of filter 102, until the period of the pulses on line 114 is the same as the period of the pulses at terminal 116 and the control voltage $V_c$ is brought to a constant value.

The frequency of zero crossings in the oscillating waveform 206 of the ringing filter 102 is an accurate representation of the current setting of the center frequency of filter 102. This can be demonstrated by considering a second-order bandpass filter with the transfer function:

$$\frac{s/\omega_p}{(s^2/\omega_p^2 + s/\omega_p Q_p + 1)}.$$

The step response of this system is:

$$\frac{1}{s}\left[\frac{s/\omega_p}{(s^2/\omega_p^2 + s/\omega_p Q_p + 1)}\right] = \frac{1/\omega_p}{(s^2/\omega_p^2 + s/\omega_p Q_p + 1)};$$

where s is the well-known complex frequency, $\omega_p$ is the center frequency of the filter transmission, and $Q_p$ is the quality factor. The time response of this function for a step input is of the form $$y(t) = A \exp(-\sigma_1 t) \sin \omega_1 t;$$

where A is a constant, $\sigma_1 = \omega_p/2Q_p$, and $\omega_1$ is the frequency of the zero crossings given by $$\omega_1 = \omega_p \sqrt{(1 - 1/4Q_p^2)}.$$

The difference between $\omega_1$ and $\omega_p$ is approximately equal to $\omega_p/8Q_p^2$ for high values of $Q_p$. This difference is very small, even for modest values of $Q_p$. Thus, for high Q factor filters, ringing the filter 102 and counting the zero crossings 208 in the resulting signal 206 is an excellent method for determining the actual center frequency setting of the filter 102.

Figure 3:
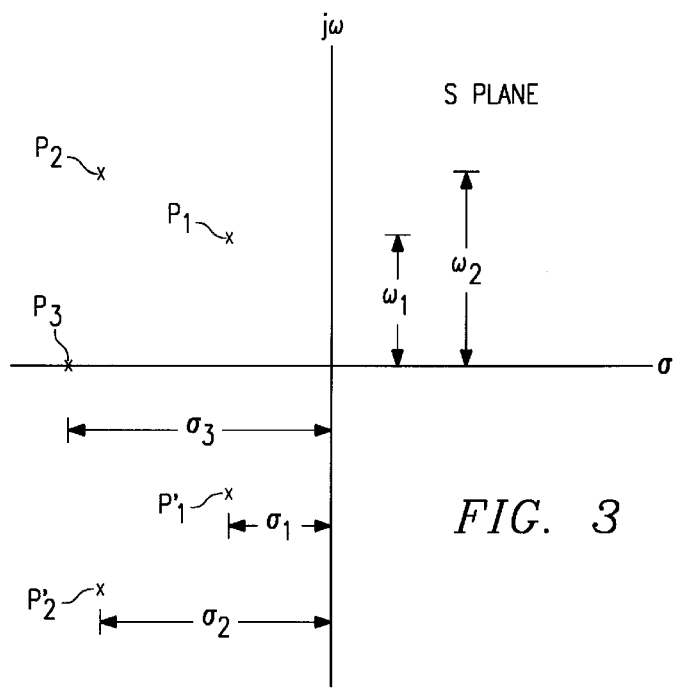
FIG. 3 is a pole-zero pattern to illustrate the second-order time domain transient response perturbation due to parasitic poles.

The effect of parasitic poles on the transient response and the magnitude response of the filter is minimal. Assuming that parasitic poles are of higher frequency than the filter passband, a possible scenario is that given in the pole-zero pattern representation shown in FIG. 3. The usual poles are indicated at $P_1$ and $P_1$. The parasitic poles are indicated at $P_2$, $P_2$ and $P_3$. The time response for a step input function with the indicated parasitic poles can be shown to be:

$$y(t) = \exp(-\sigma_1 t)\{A \sin(w_1 t) + B \exp(-(\sigma_3 - \sigma_1)t) + C \exp(-(\sigma_2 - \sigma_1)t) \sin(\omega_2 t + f_2)\};$$

where, by definition $|\sigma_1| << |\sigma_2|, |\sigma_3|$. The complex frequencies corresponding to the parasitic poles die down very fast. Therefore, these poles have a negligible impact on this technique.

Figure 4:
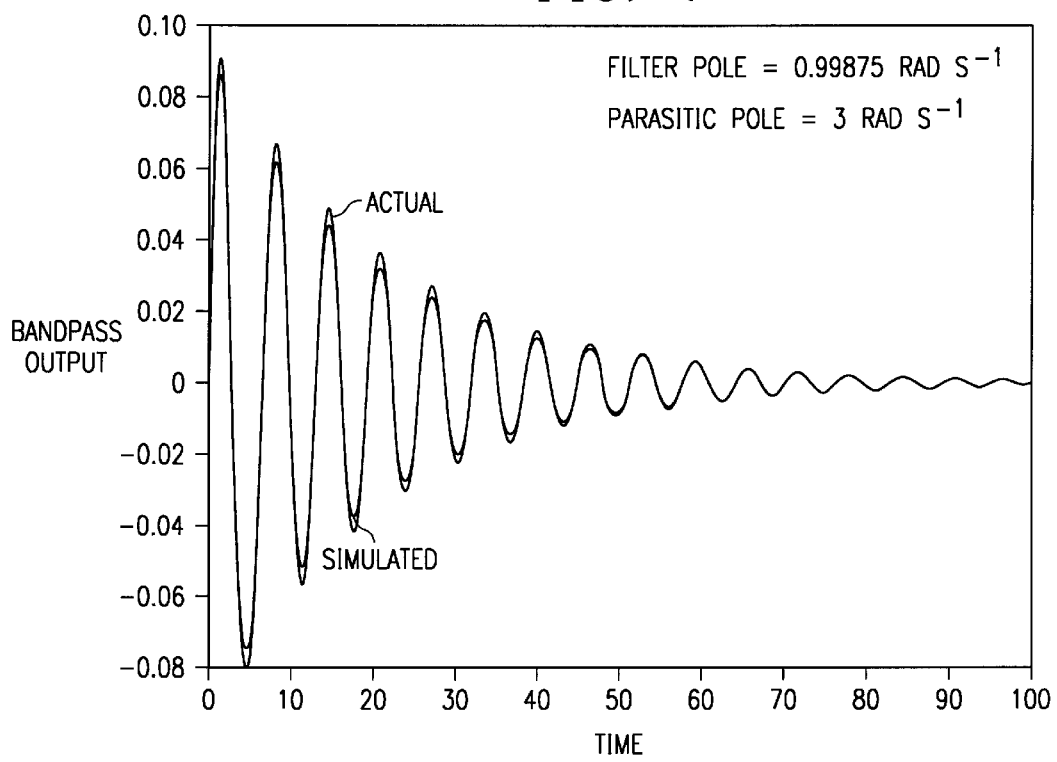
FIG. 4 is the step response of a second order bandpass filter having a Q of 10.
Figure 5:
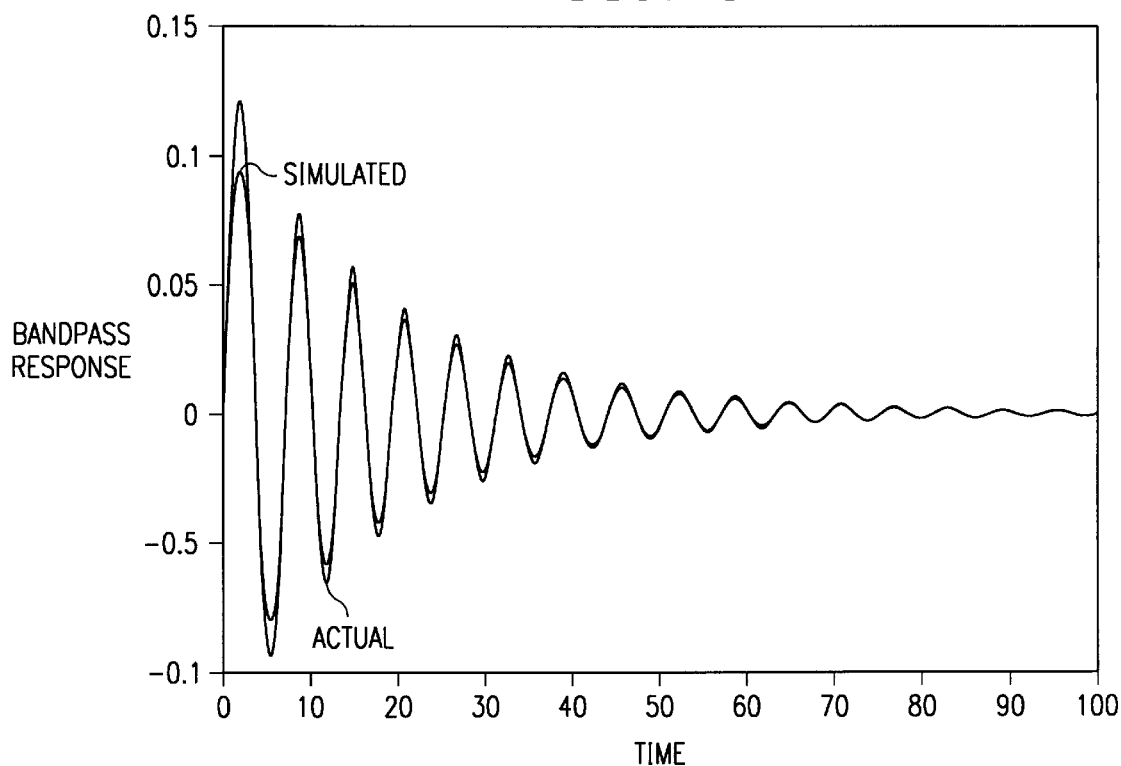
FIG. 5 shows the bandpass response of a filter with a Q of 10 having conjugate pair parasitic poles.

The zero crossing measurements thus give an excellent measure of the maximum filter transmission for high Q filters. Simulations have verified such an approach to be an order of magnitude more accurate than using a conventional phase measurement scheme. The comparisons of actual versus the simulated responses are given in FIGS. 4 and 5.

The present invention is also applicable to higher order filters. All higher order bandpass filters try to approximate an ideal transfer function with an impulse response given by:

$$A \sin(2\pi f_0 t) \sin((BW)t).$$

Figure 6:
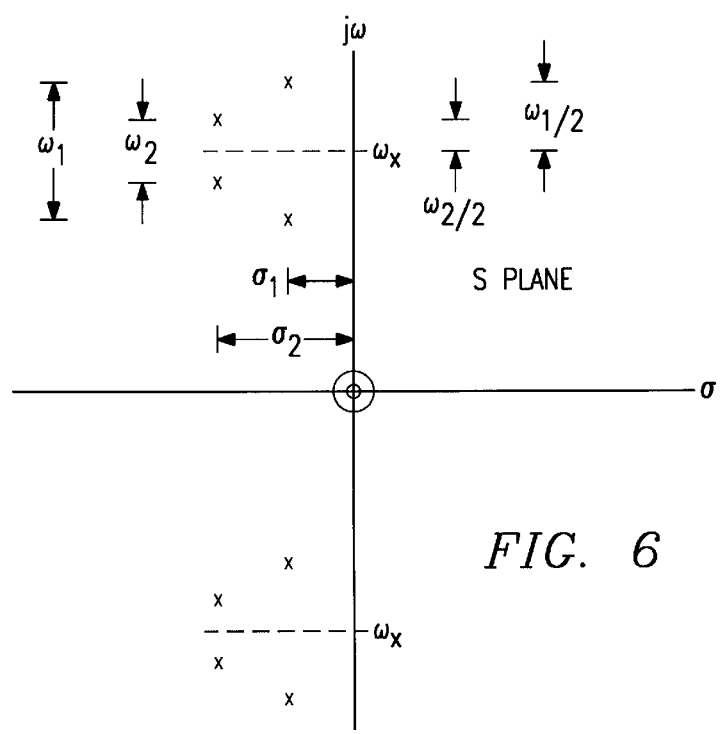
FIG. 6 is the pole-zero pattern for a higher order bandpass filter.

The ideal filter is, of course, not realizable, and has a delay of infinity. All filter approximation techniques aim to minimize the error between a rational function of s and the ideal filter characteristic. It is, therefore, reasonable to expect that the transient responses of all such filters will also closely approximate the ideal impulse response. A "physical" explanation may be evident from consideration, for example, of a Chebyshev bandpass filter. This is obtained by using the L·P to B·P transformation on the L·P prototype. For very narrow band filters, the pole locations are symmetric about the line s=j$\omega_x$, where $\omega_x$ is the arithmetic average frequency of the imaginary parts of the poles (see FIG. 6). The transient response is of the form:

$$A_1 \exp(-\sigma_1 t)\left[\sin\left(\left(\omega_x + \frac{\omega_1}{2}\right)t + \phi_1\right) + \sin\left(\left(\omega_x - \frac{\omega_1}{2}\right)t + \phi_2\right)\right] +$$

$$A_2 \exp(-\sigma_2 t)\left[\sin\left(\left(\omega_x + \frac{\omega_2}{2}\right)t + \phi_3\right) + \sin\left(\left(\omega_x - \frac{\omega_2}{2}\right)t + \phi_4\right)\right].$$

Now, $$\left[\sin\left(\left(\omega_x + \frac{\omega_1}{2}\right)t + \phi_1\right) + \sin\left(\left(\omega_x - \frac{\omega_1}{2}\right)t + \phi_2\right) = \right.$$

$$\left. 2\sin(\omega_x t + \phi_1 + \phi_2)\cos(\omega_1 t + \phi_2 - \phi_1)\right]$$

where the sine term is a sine wave corresponding to the center frequency of the bandpass filter and the cosine term is a beat frequency (a low frequency envelope). Therefore, the frequency of the zero crossings corresponds to the center frequency of the bandpass filter, the difference being on the order of about 0.1%.

Figure 7:
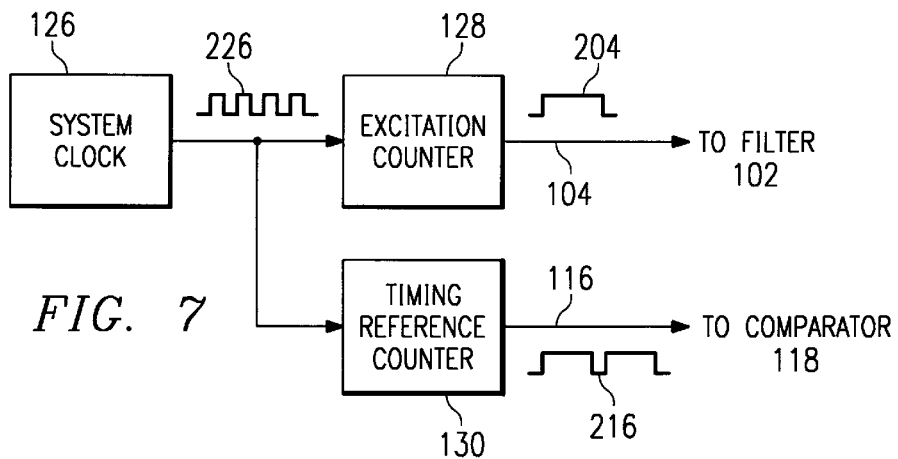
FIG. 7 is a block diagram of one implementation for generation of excitation and timing reference signals for the circuit of FIG. 1.

FIG. 7 shows one possible implementation for generation of the excitation signal 204 and timing reference signal 216 for circuit 100 of FIG. 1. A system clock 126 generates a series of clock pulses 226 which are input to an excitation counter 128. Counter 128 is hard wired or programmed to count to a number m of clock pulses to produce an excitation signal 204 having a pulse width duration of m system clock pulse cycles. Similarly, clock pulses 226 are also input to a timing reference counter 130. Counter 130 is hard wired or programmed to count to a number k of clock pulses to produce a timing reference signal 216 having a pulse width duration of k system clock pulses. Selection of the count n of zero crossing counter 112 and count k of timing reference counter 130 is made, so that the pulse duration of signal 216 will correspond to the pulse duration of signal 214 for filter 102 tuned to the desired central frequency. Any error in matching is minimized because the periods of the matched signals 214, 216 are made much longer than the period of the signal 206.

Figure 8:
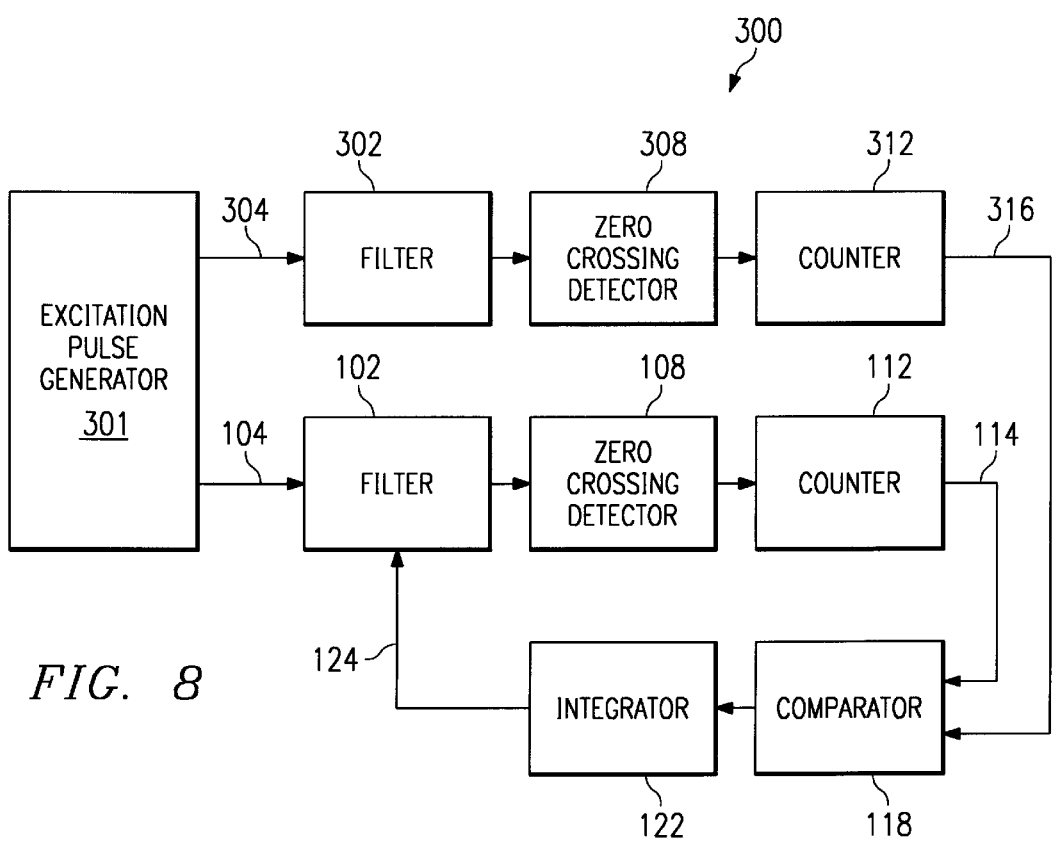
FIG. 8 is a block diagram of a modified filter tuning circuit embodiment of the present invention.

FIG. 8 shows a modified embodiment 300 of the tuning circuit 100 of FIG. 1. Here, signal 204 (see FIG. 1) is generated by an excitation pulse generator 301 (which may take the form of system clock 126 and counter 128 of FIG. 7, if desired) which is included in a single integrated circuit along with the filter 102, zero crossing detector 108, counter 112, comparator 118 and integrator 122 elements of FIG. 1. The timing reference signal 216 is now, however, generated by filter 302, zero crossing detector 308 and counter 312 elements which are configured the same as the corresponding filter 102, zero crossing detector 108 and counter 112 elements. This, therefore, presents a relationship wherein a first filter 102 can be tuned to a second filter 102, or vice versa. The same signal form 204 (FIG. 1) used to excite filter 102 via input 104 is also fed to filter 302 via a line 302. Zero crossing detector 308 then produces pulses like those of signal 210 shown in FIG. 1 from the damped oscillating waveform (similar to 206 in FIG. 1) output of filter 302. Counter 312 counts a number n of the zero detection pulses to produce an output (similar to 214 in FIG. 1) with a pulse frequency which is a 2/n multiple of the set central frequency for filter 302. The output (similar to 214 in FIG. 1) of counter 312 is then compared, as previously described for the timing reference signal input at 116, with the corresponding signal 214 from counter 112, to provide a tuning control signal to filter 102 to tune filter 102 to filter 302.

Those skilled in the art to which the invention relates will appreciate that the foregoing are merely, illustrative examples of embodiments and applications of the invention, and that changes and modifications can be made to the above, without departing from spirit and scope of the invention as defined by the appended claims.

What is claimed is:

1. A method of detecting the filter pole frequency of a filter, comprising:

exciting said filter with a pulse for causing said filter to ring to generate an oscillating waveform;

counting a predetermined number of oscillations in said oscillating waveform generated by said ringing of said filter; and comparing the elapsed time for said predetermined number of oscillations with a known reference time.

2. The method of claim 1, wherein said counting step counts the number of zero crossings in said oscillating waveform and counts for said predetermined number.

3. The method of claim 1, wherein said counting step comprises the steps of converting said oscillating waveform into a series of pulses; and digitally counting said series of pulses.

4. Apparatus for detecting the filter pole frequency of a filter, comprising:

a pulse generator for exciting said filter with a pulse for causing said filter to ring to generate an oscillating waveform;

a counter coupled to said filter, for counting a predetermined number of oscillations in said oscillating waveform generated by said ringing of said filter; and a comparator, coupled to said counter, for comparing the elapsed time of said predetermined number of oscillations with a known reference time.

5. The apparatus of claim 4, wherein said counter is a digital counter.

6. The apparatus of claim 5, further comprising a zero crossing detector for converting said oscillating waveform into a series of pulses.

7. A method of tuning a bandpass filter, comprising:

exciting said filter with a pulse for causing said filter to ring at its set center frequency to generate an oscillating waveform;

counting a predetermined number of oscillations in said oscillating waveform generated by said ringing of said filter;

comparing the elapsed time for said predetermined number of oscillations with a known reference time to generate a difference signal corresponding to the difference between said elapsed time and said known reference time; and integrating said difference signal to generate a control signal; and tuning said filter with said control signal.

8. The method of claim 7, wherein said counting step counts the number of zero crossings in said oscillating waveform and counts for said predetermined number.

9. The method of claim 7, wherein said counting step comprises the steps of converting said oscillating waveform into a series of pulses; and digitally counting said series of pulses.

10. The method of claim 7, wherein, in said comprising step, said known reference time corresponds to the elapse time for the same number of oscillations as said predetermined number of oscillations to elapse for a corresponding oscillating waveform generated by a filter ringing at a center frequency equal to a desired center frequency.

11. Apparatus for tuning a bandpass filter, comprising:

a pulse generator for exciting said filter with a pulse for causing said filter to ring at its set central frequency to generate an oscillating waveform;

a counter, coupled to said filter, for counting a predetermined number of oscillations in said oscillating waveform generated by said ringing of said filter;

a comparator, coupled to said counter, for comparing the elapsed time of said predetermined number of oscillations with a known reference time to generate a difference signal; and an integrator, coupled to said comparator, for integrating said difference signal to generate a control signal to tune said filter.

12. The apparatus of claim 11, wherein said counter is a digital counter.

13. The apparatus of claim 11, further comprising a zero crossing detector for converting said oscillating waveform into a series of pulses.

14. The apparatus of claim 11, further comprising a reference signal generator for generating said known reference time corresponding to the elapse time for the same number of oscillations as said predetermined number of oscillations to elapse for a corresponding oscillating waveform generated by a second filter identical to said first filter ringing at a center frequency equal to a desired center frequency to which said first filter is to be tuned.

* * * * *